LOW VOLTAGE CONTROL APPARATUS

Filed July 12, 1954

INVENTORS.
Robert W. Fritts,
Sebastian Karrer,
BY Brown, Jackson, Boettcher & Dienner
Att'ys

1

2,922,083

LOW VOLTAGE CONTROL APPARATUS

Robert W. Fritts, Elm Grove, Wis., and Sebastian Karrer, Port Republic, Md., assignors, by mesne assignments, to Minnesota Mining and Manufacturing Company, St. Paul, Minn., a corporation of Delaware Application July 12, 1954, Serial No. 442,843

9 Claims. (Cl. 317—133.5)

This invention relates to apparatus for control of low power circuits, and more particularly to apparatus embodying control means capable of being remotely located from the source of energy for such circuits.

As is well known in the art, thermoelectric generators are devices capable of generating only relatively low voltages (ordinarily less than one volt), and when used as a source of electrical power for operation of electrical devices, must be employed in circuits of relatively low resistance to afford the operated device a practical amount of electrical power. Since maximum output by a thermoelectric generator is realized only when the internal resistance of the thermoelectric generator (which in a thermoelectric generator capable of higher power output is very low) is matched to the resistance of a load circuit, it follows that such load circuits and any load devices incorporated therein must of necessity also be of low resistance. From a practical standpoint, this requires that the circuit wires transmitting power from the generator to the load device must be short lest the resistance of the circuit wires be unduly high with respect to the internal resistance of the thermoelectric generator. Accordingly, so far as we are aware, it has not heretofore been feasible to control remotely a load device disposed in a thermoelectric circuit from any appreciable distance without excessive loss of power in the leads running to such remotely located control.

Accordingly, it is an object of our invention to provide control apparatus having a thermoelectric generator as a source of electrical energy, a load device powered from such source, and control means capable of being located remote from such source for controlling energization of the load device.

Another object of the invention is to provide control apparatus having a thermoelectric generator or the like as a source of electrical energy, a load device, control means for controlling energization of the load device, and circuit means affording utilization of the major portion of the output of the generator for operation of the load device, and a minor portion of such output for the control means.

Another object is to provide control apparatus for controlling a load device powered from a thermoelectric source of electrical energy without excessive power loss in leads running to the remote control means and thereby afford more power at the load device.

Another object is to provide control apparatus having a thermoelectric generator or the like as a source of electrical energy, circuit means including a load circuit powered by such source, and remotely located control means which requires substantially less current for its energization than that of the load circuit.

Another object is to provide circuit means having a thermoelectric generator or the like as a source of electrical energy therefor, which circuit means provides for first impressing the full output of the generator upon remotely located control means, and switching means controlled thereby, and thereafter dividing the output at the generator between a holding circuit for said switching means and a power circuit including a load device to be operated.

2

Another object of the invention is to provide circuit means having as its source of electrical power a thermoelectric generator or the like, which circuit means includes a control circuit having remotely located control means, and a power circuit including a load device, and means controlled by the control means controlling the power circuit.

Another object of the invention is to provide control apparatus having a thermoelectric generator or the like as a source of electrical power, circuit means including a power circuit including a load device, and a control circuit including remotely located control means effective for controlling energization of the load device of the power circuit, and in which the circuit means is so arranged as to de-energize the load device of the power circuit upon failure of any portion of either of the power and control circuits of the circuit means.

Another object is to provide control apparatus having a thermoelectric generator or the like as a source of electrical power, circuit means including a power circuit supplied by a power thermocouple of the generator, a load device in the power circuit of a resistance approximately matching that of such power thermocouple, and a control circuit including control means for controlling energization of the power circuit affording fast interruption of the power circuit upon cessation or diminution of the thermal source of the thermoelectric generator.

Another object is to provide control apparatus as last aforementioned characterized by the control means in the control circuit having small differential between the current value effective to maintain the power circuit, and the current value at which the latter is de-energized, thereby providing high drop-out sensitivity of the load device upon diminution of the thermal source of the thermoelectric generator.

Another object is to provide control apparatus powered from a thermoelectric generator or the like having means including higher resistance control circuit means including remotely located control means, and low resistance power circuit means including a load device located closer to the generator, and means in the control circuit means for effecting energization of the low resistance power circuit means responsive to the remotely located control means.

A further object is to provide control apparatus including a thermoelectric generator having a divisible voltage output, and circuit means for utilizing the power of said generator in whole or in part.

Another object is to provide control apparatus having a thermoelectric generator affording more than one source of electrical energy, and circuit means embodying more than one circuit, in which the loads of such circuits may be designed to match the resistances of the sources of electrical energy of the generator therefor.

Another object is to provide control apparatus having a thermoelectric generator as a source of electrical energy, and circuit means for the generator including a control device which, when actuated, effects a reduction in current flow therethrough by division of the output of the generator, to afford thereby for the rapid drop-out of the control device upon diminution of the thermal source for the generator.

Also, as is well known, thermoelectric generators of the prior art have essentially comprised a single thermocouple or, alternatively, a plurality of thermocouples connected in series to form a thermopile developing a voltage which is simply the sum of the individual E.M.F.'s of each thermocouple. Such prior thermoelectric generators have an indivisible output, utilizable for a single function or purpose, and hence have but limited application.

Known thermoelectric generators, in the main, comprise one or more thermocouples each of which include but a pair of metallic thermocouple elements of metals separated from each other in the thermoelectric series, or, as later referred to hereinafter, one or both of such elements may be of a semi-metallic alloy. The term "semi-metallic alloy" as used in the above statement, and as hereinafter employed throughout this specification and in the appended claims, is to be understood as meaning an alloy having high thermoelectric power, nominally higher electrical resistivity, and low thermal conductivity with respect of like characteristics ordinarily exhibited by metals. Such semi-metallic elements may, when placed in a temperature gradient, afford either positive or negative Seebeck E.M.F.'s and will accordingly be denominated, respectively, positive and negative elements. Examples of suitable semi-metallic elements are as follows: the positive and negative copper-silver-selenium alloys disclosed in United States Patent No. 2,232,960 to Milnes, the positive and negative copper-silver-tellurium-selenium-sulphur alloys disclosed in United States Patent No. 2,397,756 to Schwarz, or the positive and negative silver-tellurium alloys disclosed in United States Patent No. 2,602,095 to Faus. Further examples of suitable semi-metallic alloys are disclosed in our Patent No. 2,811,571, dated October 29, 1957.

It is a further object of the invention to provide a unique thermoelectric generator, the total power output of which may be utilized in whole or in part, as desired, in various circuit arrangements, to afford multiple functions or purposes.

A further object is to provide a thermoelectric generator having at least three thermoelectric elements, and a cold junction terminal for each of the thermoelectric elements.

A further object is to provide a thermoelectric generator having at least three thermoelectric elements, at least two of which elements are of dissimilar thermoelectric materials, and a terminal for each of the elements.

A further object is to provide a thermoelectric generator having at least three thermoelectric elements connected to provide a multiplicity of internal circuits therefor.

Another object is to provide a thermoelectric generator having at least three thermoelectric elements connected to provide a multiplicity of internal circuits therefor, and a terminal for each of the elements affording a voltage difference between any two thereof.

Another object is to provide a thermoelectric generator having at least three thermoelectric elements and at least three electrical connections, one to each of the elements, affording a minimum of one hot junction and a pair of cold junctions therefor.

A further object is to provide a thermoelectric generator comprising at least three thermoelectric elements of dissimilar thermoelectric materials connected together to afford each adjacent pair of such elements a common junction.

A further object is to provide a thermoelectric generator comprising at least three thermoelectric elements, each pair of which are connected to provide a hot junction, and in which such thermoelectric elements of each pair are of different thermoelectric materials.

A further object is to provide a thermoelectric generator comprising at least three thermoelectric elements connected together to afford a hot junction, and each such element having a terminal affording a cold junction.

A further object is to provide a thermoelectric generator comprising at least two pairs of thermoelectric elements, connected to provide each such pair with a hot junction, and a minimum of three cold junctions for such elements.

A further object is to provide a thermoelectric generator comprising at least four thermoelectric elements connected to provide two thermally independent hot junctions and a minimum of three cold junctions for such elements.

It is a further object of this invention to provide a thermoelectric generator as aforementioned having at least one semi-metallic thermoelectric power element.

Further objects and advantages will be hereinafter described or will become apparent to those skilled in the art.

Now, in order to acquaint those skilled in the art with the manner of utilizing and practicing the present invention there is described below in connection with the accompanying drawings certain preferred embodiments of the invention.

Figures 1, 2, 3:
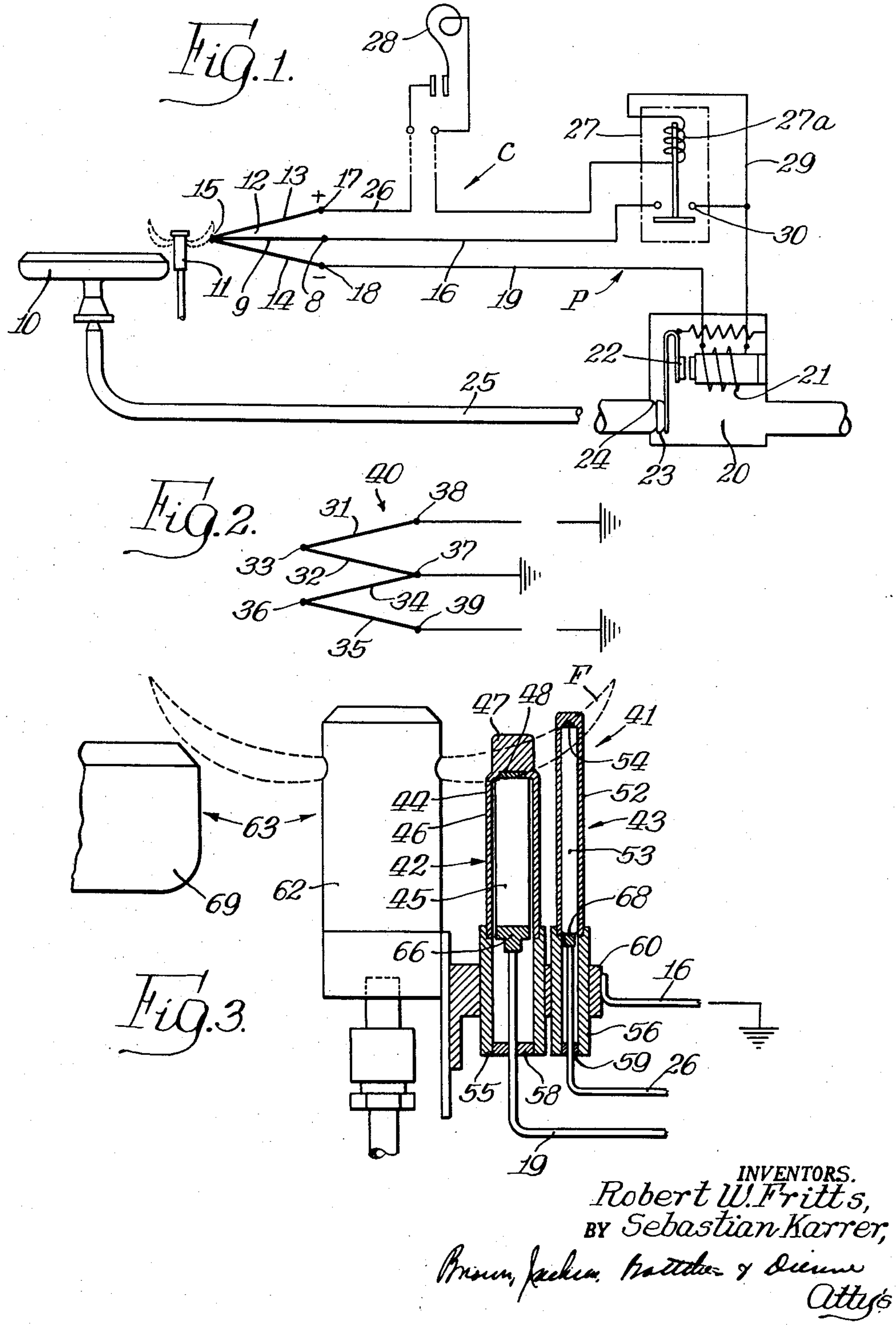
Figure 1 is a schematic illustration of apparatus embodying the invention, including one form of thermoelectric generator of our invention illustrative of the application of the invention to the control of fluid fuel burning apparatus.
Figure 2 illustrates diagrammatically another thermoelectric generator embodying the present invention, and which may be utilized in the apparatus of Figure 1 in substitution of the generator there shown.
Figure 3 is a schematic structural illustration of one form of the thermoelectric generator of Figure 2.

Referring now to Figure 1 of the drawing, there is illustrated an embodiment of the invention applied to the control of flow of fluid fuel to fuel burning apparatus which comprises a main burner 10, and an ignition or pilot burner 11 both being adapted to have connection with a source of fluid fuel. The pilot burner 11, in addition to providing means for igniting fuel issuing from the main burner 10, serves as a source of heat for a novel thermoelectric generator of the invention designated generally by the reference numeral 12.

The thermoelectric generator 12 comprises first, second and third thermoelectric elements 13, 14 and 9, respectively, arranged, as hereinafter described, in a manner having particular utility as a power source for circuit means affording selective energization of a plurality of circuits, an embodiment of which will also hereinafter be described. More specifically, the three thermocouple elements aforementioned are so arranged as to constitute in combination with each other three pairs, each pair being a thermocouple. The three thermocouple elements 13, 14 and 9 are further characterized by being made of dissimilar materials separated in the thermoelectric series. Further, the one ends of each of the three aforementioned thermoelectric elements are joined to form a common hot junction, the other end of each of the elements constituting a cold junction. As will be apparent, each of the elements 13, 14 and 9 forms a thermocouple pair with each of the other two elements and hence, three different Seebeck E.M.F.'s are developed between the three aforementioned cold junctions. Moreover, the arrangement of the thermocouple elements aforedescribed affords a thermoelectric generator in which the Seebeck E.M.F.'s of any two of the aforementioned thermocouples may be in series relation electrically, thereby affording the generator particular utility for circuits of the character, for example, hereinafter described, such utility being incapable of being afforded by the conventional two terminal thermocouple or thermopile.

As will be apparent, since the thermoelectric elements 13, 14 and 9 are of materials separated in the thermoelectric series, the maximum Seebeck E.M.F of the thermoelectric generator will be developed between two of the three terminals; for example, between terminals 17 and 18 of the thermoelectric generator illustrated in Figure 1. Correlatively, a smaller Seebeck E.M.F. will be developed between any other combination of terminals, such as, for example, between terminals 8 and 17, and between terminals 8 and 18, illustrated in Figure 1.

Referring specifically to Figure 1, for achievement of maximum E.M.F. between terminals 17 and 18, as aforementioned, the elements 13 and 14 must be of thermoelectric materials having opposite polarity and high values of Seebeck E.M.F. with reference to the conventional platinum standard. It follows that the element 9 must be of a thermoelectric material affording a Seebeck E.M.F. intermediate to the Seebeck E.M.F.'s of the elements 13 and 14. From the foregoing, it will be apparent that the element 9 in effect affords an intermediate voltage tap for the thermocouple developing the maximum Seebeck E.M.F., i.e. that comprising elements 13 and 14.

As aforementioned, the elements 13, 14 and 9 are of thermoelectric materials which may be of any well known compositions but separated from each other in the thermoelectric series (platinum being taken as a reference). For example, the elements 13 and 14 may be any metallic thermoelectric elements positive and negative, respectively, with respect to platinum and the element 9 of a metal intermediate the other two in the thermoelectric series, each of the elements 13 and 14 forming a couple with the element 9, but all elements have a common thermal (hot) and electrical junction. For example, element 13 may be of Chromel P, element 14 of constantan, and element 9 of iron, copper or Alumel. Alternatively one or both of the thermoelectric elements 13 and 14 may, in accordance with the present invention, comprise semi-metallic elements which, as already noted, afford higher Seebeck E.M.F.'s than that ordinarily exhibited by metals. When both of the elements 13 and 14 are of the aforementioned semi-metallic alloys they must be of opposite polarity in the apparatus shown and the element 9 may be any metallic element, preferably stainless steel. When only one of the elements 13 and 14 is a semi-metallic alloy (either positive or negative) the other may be any suitable thermoelectric element of opposite sign such as for example, stainless steel or constantan, and the element 9 may be any suitable metallic element intermediate the other two in the thermoelectric series. More particularly, where the element 14 is a positive semi-metallic element, the element 13 should be negative with respect to platinum (e.g. either a negative semi-metallic element as aforedescribed or a metallic element such as, for example constantan) and the element 9 may be copper or any other metallic element positive with respect to platinum as, for example, stainless steel. If the element 14 is a negative semi-metallic element, then the element 13 should be positive (e.g. either a positive semi-metallic element as aforedescribed or a positive metallic element such as stainless steel) and the element 9 should be negative, for example, constantan.

As illustrated in Figure 1, the thermoelectric elements 9, 13 and 14 aforedescribed are joined together as at 15 to form a hot junction for the thermoelectric generator subject to the heat of, for example, the pilot burner 11.

The apparatus illustrated in Figure 1 further embodies circuit means defined, in part, by a circuit wire 16 joined to element 9 at 8 forming therewith a cold junction serving, as aforementioned, as an intermediate tap for the thermoelectric generator. Other circuit wires of the circuit means, hereinafter described, are connected to the thermoelectric elements 13 and 14, respectively, as at terminal cold junctions 17 and 18. The circuit means of the apparatus of Figure 1 further embodies a power circuit, designated generally at P, of low resistance and short leads, and control circuit means, indicated generally at C, of relatively higher resistance than that of the power circuit, and may embody long leads, if necessary or desired, to extend to remotely located control means to be hereinafter described. The power circuit of relatively low resistance, embodied in the apparatus of Figure 1, comprises a circuit wire 19 connected to one side of an electrical load device indicated generally by the reference numeral 20, and more particularly, to one side of the actuating coil 21 thereof. The other side of the coil 21 is connected via the circuit wire 16 (when relay 27 is energized) to terminal 8 of the thermoelectric generator 12, it being understood that the wires 16 and 19 are of short length and of low resistance so that the entire power circuit aforedescribed, including the coil 21 of the load device, is of relatively low resistance.

In the embodiment illustrated, the load device 20 takes the form of an electro-magnetically operated valve comprising, in addition to the aforementioned energizing coil 21, an armature 22 carrying a valve 23 movable with respect to valve seat 24 opening into supply pipe 25 leading to the main burner 10, so that opening and closing of the valve 23 with respect to the valve seat 24 selectively permits or prevents flow of fluid fuel to the burner 10, as will be apparent. As already indicated, the apparatus of Figure 1 further comprises a control circuit of relatively higher resistance than that of the aforedescribed power circuit. The control circuit of the circuit means of the apparatus of Figure 1 comprises a lead wire 26 connected to the positive element 13 of the thermoelectric generator 12 as at the cold junction 17 thereof, the other end of said circuit wire 26 being connected to one side of a relay type device, indicated generally by the reference numeral 27, through a remotely located control device 28, which in the embodiment illustrated takes the form of a thermostat of suitable character. In the apparatus of our invention, the control device, such as the thermostat 28, may be remotely disposed with respect to burner 10 and pilot burner 11, as desired, and without regard to imposing a relatively high resistance in the circuit due to the lengths of the lead wires extending to the control thermostat 28. The other side of relay device 27 is suitably connected via a circuit wire 29 to the circuit wire 16 which, when the relay 27 is energized, serves as a common conductor for the power circuit P and the control circuit C, and which power and control circuits, as already noted, form a part of the circuit means of the control apparatus of the invention.

The relay device 27 may further comprise an energizing coil 27a connected in the control circuit C as aforementioned and a pair of contacts 30 connected in the lead wire 16 provide for making or breaking of the power circuit aforementioned dependent upon whether the relay 27 is or is not energized. The apparatus above described is adapted to operate as follows:

Assuming the thermoelectric generator 12, and more particularly, the hot junction 15 thereof to be subjected to heat from a suitable source as, for example, the pilot burner 11, the thermoelectric generator will produce a voltage, ordinarily but a fraction of a volt. As soon as the contacts of thermostat 28 are closed as, for example, by actuation responsive to the temperature of its environment, power from the thermoelectric generator (developed by elements 13 and 14) will flow in the circuit means of the apparatus through what might be termed an actuating circuit formed, in part, by elements of the power and control circuits. This actuating circuit, beginning at terminal 17, comprises conductor 26, contacts of the switch 28, coil 27a of the relay 27, conductor 29 through the coil 21 of the load device 20, and then via conductor 19 to negative terminal 18 of the thermoelectric generator 12. Thus, the voltage developed by the thermocouple defined by elements 13 and 14 is impressed across a circuit of relatively high resistance, including the remotely located control means 28, causing energization of the relay 27, which has a higher internal resistance than that of the load device 20. Upon energization of the relay 27 its contacts 30 in the circuit wire 16 will be closed, thereby primarily impressing the portion of the voltage developed by the thermocouple defined by element 14 and element 9 of the thermoelectric generator upon the relatively low resistance power circuit, including the load device 20, for energization and actuation of the latter. A minor portion of the output of the thermoelectric generator, via thermocouple defined by element 13 and element 9, continues to flow through the coil 27*a* of the relay 27 of the higher resistance control circuit, which power is sufficient to hold the relay in (i.e. contacts 30 closed) since, as is well known in the art, fewer ampere turns are required for holding such an electro-magnetic device in than are required initially for attracting the armature of the device to close initially contacts 30.

From the foregoing it is apparent that the aforedescribed apparatus may be described as including a thermoelectric generator the maximum voltage of which is used in circuit means to deliver power through a high resistance circuit to close contacts on its own intermediate tap, and thereby divide such power between a control circuit and a second power circuit of lower resistance to deliver higher current to a load device requiring more power for operation.

In the embodiment illustrated in Figure 1, it will be apparent that with a load device in the form of an electro-magnetically operated valve for control of fluid fuel to the main burner 10, such an electro-magnetically operated valve may be operated directly and electrically from a source of electrical energy as small as that afforded by a thermoelectric generator, while at the same time being maintained under control of a remotely located thermostat responsive to the temperature of the space heated by the burning of fuel at the main burner 10. At the same time, the apparatus provides a safety shut-off function in that should the pilot burner 11 fail for any reason and thus be unavailable for ignition of the fluid fuel issuing from the burner 10, the electro-magnetically operated valve 20 will be deenergized and returned by biasing means conventionally embodied therein to flow-preventing position thereby rendering impossible an accumulation of fluid fuel at the burner 10 unless the ignition means therefor is operative. Similarly, if any portion of the electrical circuit aforedescribed should for any reason fail, the electro-magnetically operated valve 20 will similarly be deenergized and returned to flow-preventing position. Also, in the event of reduced current flow in the control circuit due to diminution of the pilot flame, quick drop-out of relay 27 is afforded immediately since such current value will be less than that required to hold the relay in.

From the foregoing it will be seen that the control apparatus of Figure 1 affords means for remotely controlling a load device powered from a thermoelectric source of electrical energy or the like without excessive power loss in leads running to the remote control, thereby affording more power at the load device. More specifically, it will be observed that the power to operate the load device is not required to travel through the control circuit including the remotely located control device, but rather is supplied through a low resistance circuit having short leads, thereby rendering current supply to the load device independent of the resistance of the remotely located control means and the leads running thereto.

Referring now to Figure 2, there is shown a modified form of thermoelectric generator 40 of the present invention which may, in one form thereof, be utilized in the circuit means of Figure 1 in lieu of the thermoelectric generator there shown. As indicated in the drawing, this modified thermocouple comprises a first pair of any suitable thermoelectric elements 31 and 32 joined as at 33 to provide a first hot junction, and a second pair of any suitable thermoelectric elements 34 and 35 joined as at 36 providing the device a second hot junction. As illustrated, the pairs of thermoelectric elements are connected in series as by connection of the opposite ends respectively of elements 32 and 34 to provide a common cold junction at terminal 37. The other ends of elements 31 and 35 have cold junctions at terminals 38 and 39, respectively.

Similarly to the thermoelectric generator illustrated in Figure 1, the thermoelectric generator of Figure 2 has three cold junctions and hence three voltage terminals connectable (when the generator of Figure 2 is inserted in the circuit illustrated in Figure 1) in various combinations.

The voltage at cold junction or terminal 38 is the Seebeck E.M.F. developed between it and cold junction at terminal 37. Likewise, the voltage at cold junction or terminal 39 is the Seebeck E.M.F. developed between it and cold junction at terminal 37. Depending upon the choice of thermoelectric materials for the elements 31 and 35, respectively, of the pairs of thermoelectric elements these voltages may be quite large and positive or negative with respect to terminal 37.

In order that the maximum Seebeck E.M.F. be developed between terminals 38 and 39, the elements 32 and 35 should be made of materials exhibiting Seebeck E.M.F.'s of the same polarity with respect to platinum, and thermoelectric elements 31 and 34 should be of materials affording Seebeck E.M.F.'s of the same polarity but opposite to that afforded by elements 32 and 35. It follows that a smaller Seebeck E.M.F. will be developed between any other combination of terminals such as, for example, between terminals 37 and 39 and between terminals 37 and 38. From the foregoing, it will be apparent that the terminal 37 in effect affords a tap for voltage intermediate that developed between terminals 38 and 39. The aforementioned thermoelectric elements 31, 32, 34 and 35 may be of any of the aforedescribed compositions and various combinations thereof affording Seebeck E.M.F.'s of the polarity required, as aforementioned.

It will be appreciated that the thermoelectric generator 40 admits of further combination and arrangements of suitable thermoelectric elements such as, for example, fabricating elements 31 and 34 of metal, such as stainless steel, and elements 32 and 35 of any of the aforementioned negative semi-metallic alloys, or alternatively fabricating elements 31 and 34 of any of the aforementioned positive semi-metallic alloys and elements 32 and 35 of metal. In each of the two forms of devices last noted the metal elements would contribute only a small E.M.F.

It will be observed from the above that by appropriate choice of the thermoelectric materials for the elements of the device, that a wide range of voltage combinations is available.

Referring now to Figure 3, there is shown a thermoelectric generator 41, constructed in accordance with the principles above discussed in connection with Figure 2 of the drawing, comprising a pair of thermocouples 42 and 43, which may embody the essential features of any of the constructions shown in our copending applications, Serial No. 394,008, filed November 24, 1953; Serial No. 394,073, filed November 24, 1953; and Serial No. 394,074, filed November 24, 1953, now Patent No. 2,790,021. The thermocouples 42 and 43 most closely approximate the structure shown in our application last referred to although it will be understood that the design and arrangement of the elements may be varied as desired to suit the particular requirements to which the thermoelectric generator is to be put.

Referring firstly to the thermocouple 42 it will be observed that it comprises a pair of thermocouple element means 44 and 45, the latter element, for purposes of this embodiment of the invention, is of semi-metallic composition, as aforementioned, and is denominated as the "power" element of the thermocouple. The thermocouple element means 44 is of generally cup-shaped configuration preferably fabricated of stainless steel including a tubular sleeve or sheath portion 46, and a closed end or tip portion 47 which serves as a heat probe for the thermocouple. The element 45 and the element 44 are joined at one end by a contact electrode 48 to afford a hot junction for the thermocouple. The stainless steel sheath 44 serves to enclose the power element 45. The voltage developed in the sheath 44 is small by comparison to that of the power element 45.

The thermocouple 43, except for the configuration thereof, is constructed similarly to thermocouple 42 to the extent above described and it also comprises a pair of thermocouple element means 52 and 53. The thermocouple element 52 is preferably fabricated of stainless steel, and is formed with a sleeve or sheath portion enclosing the thermocouple element 53, which is also of semi-metallic composition, but of opposite polarity to that of element 45, and may, for reasons which will be apparent, be termed a "control" element. The control element 53 is mechanically and electrically connected at the end thereof adjacent the closed end of the outer tubular thermocouple means 52 at the hot junction by means of a contact 54. The voltage developed in sheath or thermocouple element 52 is small by comparison to that of element 53 and hence need not necessarily be of opposite sign with respect to element 44 of thermocouple 42.

As already indicated in the preferred form of this embodiment of our invention, the outer thermocouple element means 44 and 52 of the pair of thermocouples 42 and 43 are preferably of stainless steel or of an iron alloy and the inner thermocouple element means 45 and 53 are made of appropriate semi-metallic materials previously mentioned.

The pair of thermocouples 42 and 43 further comprise sheath extensions 55 and 56, respectively, which are suitably attached as by brazing or the like to the open ends of the outer tubular thermocouple element means 44 and 52. The open ends of the sheath extensions 55 and 56 embody sealing means 58 and 59, respectively, to provide for the hermetic sealing of the inner elements 45 and 53 of the thermocouples 42 and 43, respectively. As shown, the sheath extensions 55 and 56 of the pair of thermocouples 42 and 43 are mounted in a clamp 60 which, as shown, is disposed in juxtaposition of a pilot burner 62 of a pilot burner and main burner assembly indicated generally at 63.

It will be readily apparent that the generator 41 may be embodied in the apparatus and circuit means of Figure 1 by electrical connection of lead 19 with cold junction contact 66 of the power element 45, with the lead extending in sealed relation through the sealing means 58; electrical connection of lead 26 with cold junction contact 68 of control element 53 extending in sealed relation through the sealing means 59; and electrical connection of lead 16 to the clamp 60 for supporting the pair of thermocouples in juxtaposition and serving as a common outer cold junction for the pair of thermocouples 42 and 43.

The burner assembly 63 comprising the pilot burner 62 and the main burner 69, may, for example, be of the arrangement of Figure 1 in which the pilot burner provides for igniting the main burner when fuel is admitted thereto in the manner already described.

Assuming now that the device above described as Figure 3 is embodied in a circuit of the characteristics of Figure 1 and in association with a main and pilot burner as illustrated, it will be observed that in normal operation the pilot burner flame, indicated at F, bathes the thermally independent hot junctions of both thermocouples 42 and 43. Due to the side by side positioning of the thermocouples 42 and 43 and thermal independency of the hot junctions thereof with respect to the flame of the pilot burner, it will be observed that the voltages at the terminals for leads 16 and 26 are much more sensitive to a reduction in gas pressure than is the voltage developed in the leads 19 and 26 of the thermocouple 42. Assuming a condition in which the gas pressure drops below normal so that the pilot burner 62, although continuing to burn, can no longer ignite the main burner 69 in juxtaposition thereof, the pilot flame will fall short of the upper end of thermocouple 43 even though the thermocouple 42 may still be heated. The configuration of the thermocouple 43 is preferably such that it will cool rapidly by radiation and since it is mounted away from the hot main burner 69 where its environment is primarily the relatively cool fire box walls, the voltage developed between terminals 16 and 26 decreases rapidly upon reduction of gas pressure.

While initially the full output of the generator 41 is impressed upon the control circuit for actuation of the load device, as in the preceding embodiments, it will be apparent that after such actuation the thermocouple 42 serves as a source of electrical energy for operation of the electromagnetic gas valve, such as the load device 20 of Figure 1 while the thermocouple 43 serves as a source of energy for the control circuit previously described to control the heating cycle in response to a temperature sensing device such as the thermostat 28. Under the usual circumstances of installation these two situations do not require like amounts of power and a factor to be taken into account in the construction of the thermocouples 42 and 43 should be such that, for the sake of efficiency, to match the internal resistances of the thermocouples and the loads associated therewith in the circuit means including the power and control circuits previously described. Accordingly, as illustrated in Figure 3, the cross-sectional area of the element 45 is larger than that of element 53.

As previously mentioned, mechanical and electrical connection between the outer element 44 and the active element 45 at the hot junction, and electrical connection at the cold junction and of the active element 45 are made by contact electrodes 48 and 66, respectively, and similarly contact electrodes 54 and 68 provide like connections for the thermoelectric elements of the thermocouple 43. The contact electrodes should preferably be of low thermal and electrical resistance and chemically stable with respect to the active semi-metallic elements 45 and 53, respectively.

It has been discovered, as disclosed and claimed in the Russell E. Fredrick, Robert W. Fritts and William V. Huck Patent No. 2,811,569 dated October 29, 1957, that for thermoelectric elements of the character under consideration, that contact electrodes comprising iron or certain iron alloys afford contacts of the aforementioned characteristics. The contacts may be applied by mere pressure in all cases with respect of the lead-tellurium, lead-tellurium-selenium, and promoted lead-tellurium alloys or compositions or may be bonded to negative elements of the aforementioned lead-tellurium, lead-tellurium-selenium alloys or compositions, and the positive and negative promoted lead-tellurium alloys and compositions.

Suitable contact electrodes for the other semi-metallic thermoelectric elements; that is, those disclosed in the aforementioned patents to Milnes, Schwarz and Faus, are disclosed in those patents respectively, or will be obvious to those skilled in the art. Where the thermoelectric elements are of suitable known metallic materials no contacting problem is encountered.

It is to be understood that the embodiments aforedescribed are to be considered as illustrative only, reference being made to the appended claims for delineation of the scope of the invention.

We claim:

1. In combination, circuit means comprising a power circuit of relatively low resistance, and a control circuit of relatively higher resistance, a source of electrical energy for said circuits comprising a thermoelectric generator having an intermediate tap, said circuits having a common lead connected to said intermediate tap, switching means in said control circuit for controlling flow of electrical energy through said common lead, means for initially impressing the output of said thermoelectric generator upon said switching means for energization thereof to effect flow of electrical energy through said common lead thereby effecting division of the output of said thermoelectric generator between said control circuit and said power circuit, a major portion of said output going to the latter, the remainder of the output continuing to flow in said control circuit to maintain said switching means energized.

2. Apparatus according to claim 1 in which the switching means comprises an electro-magnetic relay having a winding in said control circuit, and a set of contacts connected through said common lead to said intermediate tap.

3. In combination, a source of heat, a thermoelectric generator having a pair of thermally independent hot junctions subject to said source of heat so that said generator affords a source of electrical energy and at least three terminals for the delivery therebetween of portions or the whole of the power output thereof, a load device, control means, circuit means for electrically connecting said load device and control means in series relation between a pair of said terminals to apply the whole output of said thermoelectric generator thereto, upon heating of said pair of hot junctions by said source of heat, switching means electrically connected in said circuit means and responsive to predetermined heating of said hot junctions for electrically connecting said load device with a portion of the output of said thermoelectric generator through a second pair of the terminals thereof, and said switching means electrically disconnecting said load device from said last named pair of terminals upon diminution of said source of heat with respect to at least one of said hot junctions.

4. In combination, a source of electrical energy having three terminals, means defining a first circuit connected between a first and a second of said terminals, means defining a second circuit connected between said second terminal and the third of said terminals, said first and second circuits having a common lead affording continuous series circuit connection of portions of said first and second circuits and said first and third terminals, and switching means having contacts normally interrupting current flow through said common lead to provide for initial current flow from said source through said series circuit only, said switching means also having means responsive to predetermined current flow through said series circuit for actuating said contacts to circuit making position permitting current flow through said common lead and effecting division of the output of said source for simultaneous flow of separate portions of said output through said first and second circuits, respectively.

5. In combination, a source of electrical energy having three terminals, means defining a relatively low resistance first circuit connected between a first and a second of said terminals, means defining a relatively higher resistance second circuit connected between said second terminal and the third of said terminals, said first and second circuits having a common lead affording series circuit connection of portions of said first and second circuits and said first and third terminals, and switching means having contacts normally interrupting current flow through said common lead to provide for initial current flow from said source through said series circuit only, said switching means also having means in said second circuit responsive to predetermined current flow through said series circuit for actuating said contacts to circuit making position permitting current flow through said common lead and effecting division of the output of said source between said first and second circuits, a major portion of said output going to said first circuit, and a minor portion of said output going to said second circuit to maintain said actuating means energized.

6. In combination, a source of electrical energy having three terminals, a relatively low resistance load circuit connected between a first and a second of said terminals and including an electroresponsive load device, a relatively higher resistance control circuit connected between said second terminal and the third of said terminals and including a circuit controlling device, said control and load circuits having a common lead affording series circuit connection of portions of said control and load circuits including said circuit controlling device, said load device and said first and third terminals, and switching means having contacts normally interrupting current flow through said common lead to provide for initial current flow from said source through said series circuit only, said switching means also having means in said control circuit responsive to predetermined current flow through said series circuit less than that required for actuation of said load device for actuating said contacts to circuit making position permitting current flow through said common lead and effecting division of the output of said source between said load and control circuits, a major portion of said output going to said first circuit for energization and actuation of said load device, and a minor portion of said output going to said control circuit to maintain said actuating means energized.

7. In combination, a thermoelectric generator source of electrical energy having three terminals, a relatively low resistance load circuit connected between a first and a second of said terminals and including an electroresponsive valve, a relatively higher resistance control circuit connected between said second terminal and the third of said terminals and including a thermostat located remote from said generator, said load and control circuits having a common lead affording series circuit connection of portions of said load and control circuits including said thermostat, said valve and said first and third terminals, and a relay having contacts biased toward a position interrupting current flow through said common lead to thereby provide for initial current flow from said generator through said series circuit only, said relay having an electroresponsive operator in said control circuit responsive to predetermined current flow through said series circuit less than that required for actuation of said valve for actuating said contacts to circuit making position permitting current flow through said common lead and effecting division of the output of said generator between said load and control circuits, a major portion of said output going to said load circuit for actuation of said electroresponsive valve, and a minor portion of said output going to said control circuit to maintain said relay operator energized.

8. In combination, a source of electrical energy having two terminals and an intermediate tap, a circuit controlling device and a load device continuously connected in series circuit with said terminals, normally open contacts connected to said intermediate tap and to said series circuit at a point intermediate said circuit controlling device and said load device, and actuating means in said series circuit responsive to predetermined current flow therein for closing said contacts to thereby establish separate circuits for energization of said circuit controlling device with a portion of the output from said source and simultaneous energization of said load device with the remainder of the output from said source.

9. In combination, a thermoelectric generator source of electrical energy having two terminals and an intermediate tap, a circuit controlling device remote from said generator and an electroresponsive load device in proximity to said generator connected in series circuit with said terminals, normally open contacts connected to said intermediate tap and to said series circuit at a point intermediate said circuit controlling device and said load device and adjacent said load device, and actuating means in said series circuit responsive to predetermined current flow therein less than that required for actuation of said load device for closing said contacts to thereby establish a relatively low resistance circuit including said load device, and a relatively higher resistance circuit including said circuit controlling device and said actuating means, a major portion of the output of said generator going to said low resistance circuit for actuation of said load device, and a minor portion of said output going to said higher resistance circuit to maintain said actuating means energized.

References Cited in the file of this patent

UNITED STATES PATENTS

| | | |
|---|---|---|
| 2,084,654 | Ray | June 22, 1937 |
| 2,268,960 | Ray | Jan. 6, 1942 |
| 2,307,956 | Ray | Jan. 12, 1943 |
| 2,383,676 | Paille | Aug. 28, 1945 |
| 2,464,945 | Rouse | Mar. 22, 1949 |
| 2,567,876 | Dahline | Sept. 11, 1951 |
| 2,602,095 | Faus | July 1, 1952 |
| 2,615,511 | Ray | Oct. 28, 1952 |
| 2,685,665 | Price | Aug. 3, 1954 |
| 2,691,707 | Lovejoy | Oct. 12, 1954 |
| 2,696,118 | Petry | Dec. 7, 1954 |
| 2,775,291 | Wilson | Dec. 25, 1956 |

FOREIGN PATENTS

| | | |
|---|---|---|
| 684,301 | Great Britain | Dec. 17, 1952 |